US012796363B2

(12) United States Patent
Chang et al.

(10) Patent No.: US 12,796,363 B2
(45) Date of Patent: Nov. 10, 2026

(54) METHOD OF PATTERNING ELEMENTAL METALS

(71) Applicants: Samsung Electronics Co., Ltd., Suwon-si (KR); The Regents of the University of California, Oakland, CA (US)

(72) Inventors: Jane P. Chang, Los Angeles, CA (US); Owen Watkins, Los Angeles, CA (US); Harsono S. Simka, Saratoga, CA (US); Ryan Sheil, Los Angeles, CA (US)

(73) Assignees: Samsung Electronics Co., Ltd., Suwon-si (KR); The Regents Of The University Of California, Oakland, CA (US)

( * ) Notice: Subject to any disclaimer, the term of this patent is extended or adjusted under 35 U.S.C. 154(b) by 309 days.

(21) Appl. No.: 18/747,387

(22) Filed: Jun. 18, 2024

(65) Prior Publication Data

US 2024/0429065 A1 Dec. 26, 2024

Related U.S. Application Data

(60) Provisional application No. 63/522,620, filed on Jun. 22, 2023.

(51) Int. Cl.

*H10P 50/00* (2026.01)
*H10P 14/60* (2026.01)

(Continued)

(52) U.S. Cl.

CPC .......... *H10P 50/71* (2026.01); *H10P 14/6316* (2026.01); *H10P 14/6319* (2026.01);

(Continued)

(58) Field of Classification Search

CPC .. H10P 50/71; H10P 14/6316; H10P 14/6319; H10P 14/6532; H10P 14/6939;

(Continued)

(56) References Cited

U.S. PATENT DOCUMENTS

| | | | | |
|---|---|---|---|---|
| 5,236,550 | A * | 8/1993 | Abt | C23F 4/00 216/75 |
| 10,522,467 | B2 | 12/2019 | Ishizaka et al. | |

(Continued)

FOREIGN PATENT DOCUMENTS

| | | | | |
|---|---|---|---|---|
| CN | 117597766 | | 2/2024 | |
| TW | 1395267 | B * | 5/2013 | H10D 64/01344 |
| WO | WO-2021071777 | A1 * | 4/2021 | H10P 72/0468 |

OTHER PUBLICATIONS

Rouwenhort et al., "On the mechanism for the plasma-activated N2 dissociation on Ru surfaces", J. Phys. D: Appl. Phys 54 (2021), Abstract. (Year: 2021).*

(Continued)

*Primary Examiner* — Binh X Tran
*Assistant Examiner* — Christopher Remavege
(74) *Attorney, Agent, or Firm* — Womble Bond Dickinson (US) LLP

(57) ABSTRACT

A method of manufacturing an interconnect in a metal layer in a back-end-of-line of a semiconductor device includes $N_2$ plasma passivation, through an opening a hard mask, of a ruthenium layer on a substrate. The $N_2$ plasma passivation forms a ruthenium nitride layer on the ruthenium layer. The ruthenium nitride layer includes a first portion aligned with the opening and a second portion underneath the hard mask. The method also includes $H_2$ plasma reduction of the ruthenium nitride layer after the $N_2$ plasma passivation. The $H_2$ plasma reduction removes the first portion of the ruthenium nitride layer. The method also includes $O_2$ plasma etching the ruthenium layer after the $H_2$ plasma reduction. The (Continued)

method also includes repeatedly performing the $N_2$ plasma passivation, the $H_2$ plasma reduction, and the $O_2$ plasma etching to remove the ruthenium layer down to the substrate.

20 Claims, 7 Drawing Sheets

(51) Int. Cl.

| | |
|---|---|
| ***H10P 14/692*** | (2026.01) |
| ***H10P 50/26*** | (2026.01) |
| ***H10P 76/40*** | (2026.01) |

(52) U.S. Cl.
CPC ...... *H10P 14/6532* (2026.01); *H10P 14/6939* (2026.01); *H10P 50/267* (2026.01); *H10P 50/269* (2026.01); *H10P 76/405* (2026.01)

(58) Field of Classification Search
CPC .... H10P 50/267; H10P 50/269; H10P 76/405; H10P 32/30
See application file for complete search history.

(56) References Cited

U.S. PATENT DOCUMENTS

| | | | | |
|---|---|---|---|---|
| 11,322,365 | B2 | 5/2022 | Murakami | |
| 11,749,532 | B2 | 9/2023 | Jiang et al. | |
| 11,798,813 | B2 | 10/2023 | Wang et al. | |
| 2017/0108768 | A1 * | 4/2017 | Hsu | G03F 1/24 |
| 2019/0115255 | A1 * | 4/2019 | Kazem | C23C 16/045 |
| 2020/0051833 | A1 * | 2/2020 | Chen | H10P 50/242 |
| 2021/0118693 | A1 * | 4/2021 | Joy | H10N 50/10 |
| 2022/0359224 | A1 * | 11/2022 | Jiang | H01J 37/32449 |
| 2022/0392752 | A1 * | 12/2022 | Lin | H01J 37/32467 |
| 2023/0420267 | A1 | 12/2023 | Oyola-Reynoso et al. | |
| 2024/0053668 | A1 * | 2/2024 | Chen | G03F 1/24 |
| 2024/0087899 | A1 * | 3/2024 | Liu | H10D 64/01 |

OTHER PUBLICATIONS

Cattaruzza et al., “On the synthesis and thermal stability of RuN, an uncommon nitride”, Surface & Coatings Technology 295 (2016) 93-98. (Year: 2016).*
TW I395267 B, Abstract. (Year: 2026).*
WO-2021071777-A1, Machine Translation. (Year: 2026).*

* cited by examiner

METHOD OF PATTERNING ELEMENTAL METALS

CROSS-REFERENCE TO RELATED APPLICATION(S)

The present application claims priority to and the benefit of U.S. Provisional Application No. 63/522,620, filed Jun. 22, 2023, the entire content of which is incorporated herein by reference.

BACKGROUND

1. Field

The present disclosure relates to various embodiments of methods of manufacturing metal lines for semiconductor devices.

2. Description of the Related Art

During the back-end-of-line (BEOL) process of manufacturing a semiconductor device, metal interconnect lines are formed in a variety of metal layers (e.g., metal layer M1, metal layer M2, etc.). In some related art semiconductor devices, the metal interconnect lines are formed of copper, which may be readily electroplated into the desired pattern. However, at smaller scales, such as below 15 nm width, the resistivity of copper increases due to photon scattering, which makes copper unsuitable for further semiconductor scaling.

Other related art semiconductor devices may utilize ruthenium to form the metal interconnect lines in the BEOL process. Unlike copper, ruthenium does not have increased resistivity at smaller scales. Ruthenium is typically etched into the desired pattern utilizing a photoresist or a hard mask. However, related art etching processes, such as $O_2$ plasma etching of the ruthenium layer, results in the generation of volatile compounds, including ions and radials. Radicals are isotropic and result in the ruthenium layer being undercut underneath the photoresist or the hard mask during the related art $O_2$ plasma etching task. Accordingly, these related art processes of etching ruthenium have insufficient fidelity (i.e., insufficient profile control), which may inhibit further scaling of semiconductor devices. For instance, FIG. 1 depicts a related art method of $O_2$ etching a ruthenium (Ru) layer 101 on a substrate 102 through an opening 103 in a hard mask 104. In the related art $O_2$ plasma etching process, the ruthenium layer 101 is undercut underneath the hard mask 104 and the ruthenium layer 101 is curved outwardly. Additionally, in the related art method, upper corners 105 of the hard mark 104 become rounded, which scatters incident ions and may thereby cause the ruthenium layer 101 to be further undercut.

The above information disclosed in this Background section is only to enhance understanding of background information pertaining to the present disclosure and may contain information that does not constitute prior art.

SUMMARY

The present disclosure relates to various embodiments of a method of manufacturing an interconnect in a metal layer in a semiconductor back-end-of-line process. In one embodiment, the method includes an $N_2$ plasma task, through an opening in a hard mask, a ruthenium layer on a substrate including transistors. The $N_2$ plasma passivation task forms a ruthenium nitride layer on the ruthenium layer, and the ruthenium nitride layer includes a first portion aligned with the opening and a second portion underneath the hard mask. The method also includes performing an $H_2$ plasma reduction task on the ruthenium nitride layer after the $N_2$ plasma passivation task. The $H_2$ plasma reduction task removes the first portion of the ruthenium nitride layer. The method also includes $O_2$ plasma etching the ruthenium layer after the $H_2$ plasma reduction task, and repeatedly performing the $N_2$ plasma passivation task, the $H_2$ plasma reduction task, and the $O_2$ plasma etching task to remove the ruthenium layer down to the substrate.

The method may also include performing a forming gas anneal.

The $H_2$ plasma reduction task may include a mixture of $H_2$ gas and a noble gas.

The noble gas may be argon (Ar).

A ratio of $H_2$:Ar may be in a range from 1:2 to 4:1.

The $N_2$ plasma passivation task may be performed with a radio frequency power in a range from approximately 300 to approximately 700 W, with a bias is in a range from approximately 8 W to approximately 12 W, with a pressure in a range from approximately 24 mTorr to approximately 36 mTorr, and for a duration of approximately 24 seconds to approximately 36 seconds.

The $N_2$ plasma passivation task may be performed with a radio frequency power of approximately 500 W, a bias of approximately 10 W, a pressure of approximately 30 mTorr, and for a duration of approximately 30 seconds.

The $H_2$ plasma reduction task may be performed with a radio frequency power in a range from approximately 300 W to approximately 700 W, a bias in a range from approximately 12 W to approximately 18 W, a pressure in a range from approximately 40 mTorr to approximately 60 mTorr, and for a duration of approximately 12 seconds to approximately 18 seconds.

The $H_2$ plasma reduction task may be performed with a radio frequency power of approximately 500 W, a bias of approximately 15 W, a pressure of approximately 50 m Torr, and for a duration of approximately 15 seconds.

The $H_2$ plasma reduction task may be performed for a duration that is approximately half of a duration of the $N_2$ plasma passivation task and/or the $O_2$ plasma etching task.

The $H_2$ plasma reduction task may be performed at at least an approximately 50% higher pressure than the $N_2$ plasma passivation task and/or the $O_2$ plasma etching task.

The hard mask may include silicon dioxide ($SiO_2$) or silicon nitride ($SiN_x$).

A thickness of the ruthenium layer may be in a range from approximately 20 nm to approximately 400 nm.

The number of cycles may be in a range from 20 to 400.

The present disclosure also relates to a method including $N_2$ plasma passivation, through an opening a hard mask, of a ruthenium layer. The $N_2$ plasma passivation task forms a ruthenium nitride layer on the ruthenium layer. The ruthenium nitride layer includes a first portion aligned with the opening and a second portion underneath the hard mask. The method also includes $H_2$ plasma reduction of the ruthenium nitride layer after the $N_2$ plasma passivation task. The $H_2$ plasma reduction task removes the first portion of the ruthenium nitride layer. The method further includes $O_2$ plasma etching the ruthenium layer after the $H_2$ plasma reduction task, and repeatedly performing the $N_2$ plasma passivation task, the $H_2$ plasma reduction task, and the $O_2$ plasma etching task.

The $H_2$ plasma reduction task may include a mixture of $H_2$ gas and a noble gas.

The $H_2$ plasma reduction task may be performed for a duration that is approximately half of a duration of the $N_2$ plasma passivation task and/or the $O_2$ plasma etching task.

The $H_2$ plasma reduction task may be performed at at least an approximately 50% higher pressure than the $N_2$ plasma passivation task and/or the $O_2$ plasma etching task.

Following the $O_2$ plasma etching, the ruthenium layer may have a substantially straight sidewall angle.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features or tasks may be combined with one or more other described features or tasks to provide a workable method or system.

BRIEF DESCRIPTION OF THE DRAWINGS

The features and advantages of embodiments of the present disclosure will be better understood by reference to the following detailed description when considered in conjunction with the drawings. The drawings are not necessarily drawn to scale.

DETAILED DESCRIPTION

Figure 1:
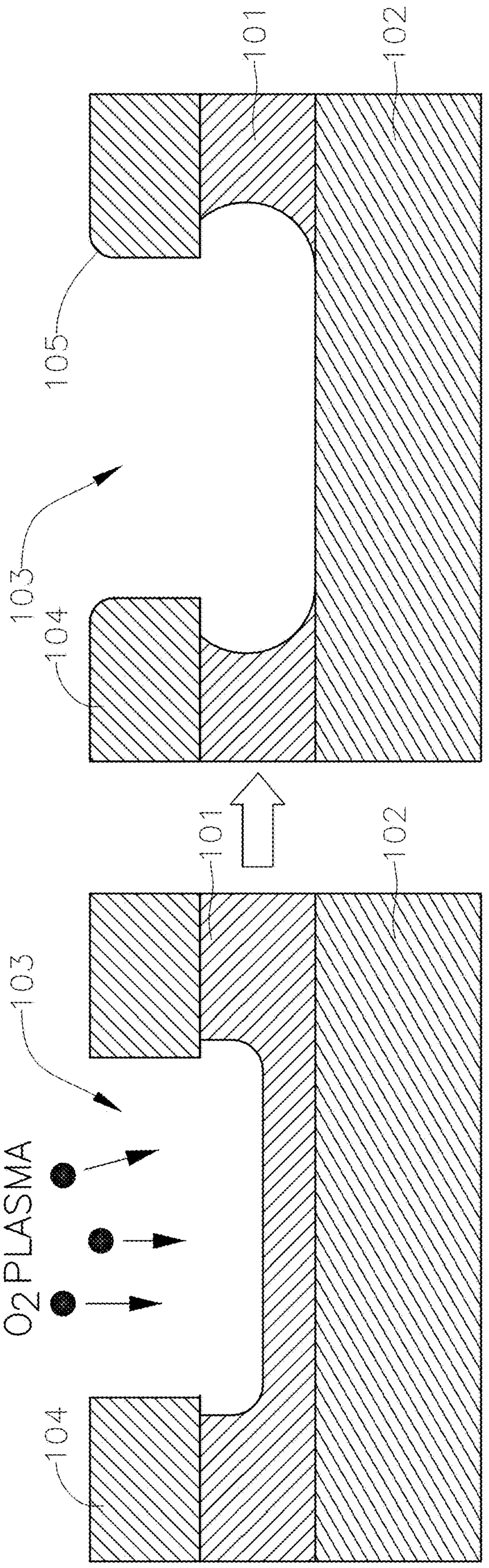
FIG. 1 PRIOR ART
FIG. 1 depicts a related art method of etching a ruthenium layer.

The present disclosure relates to various embodiments of a method of forming ruthenium metal lines in the back-end-of-line (BEOL) of a semiconductor device, such as the metal lines in the M1 metal layer and/or the M2 metal layer of the BEOL. In one or more embodiments, the method includes iteratively performing an $N_2$ plasma passivation task, an $H_2$ plasma reduction task, and an $O_2$ plasma etching task of a ruthenium layer through a patterned hard mask. The $N_2$ plasma passivation task forms an $RuN_x$ diffusion barrier along the sidewall of the ruthenium layer that is configured to prevent the $O_2$ plasma etching task from undercutting the ruthenium underneath the hard mask. The $H_2$ plasma reduction task is configured to selectively remove a portion of the $RuN_x$ diffusion barrier in the openings of the hard mask and leave the portion of the $RuN_x$ diffusion barrier underneath the hard mask (i.e., along the sidewalls of the ruthenium layer). Additionally, in one or more embodiments, the $H_2$ plasma reduction task may include a noble gas, such as argon, which shifts the electron temperature distribution and is thereby configured to prevent (or at least mitigate against) the $H_2$ plasma reduction task excessively etching the hard mask (e.g., rounding the upper corners of the hard mask). Otherwise, excessive rounding of the corners of the hard mask during the $H_2$ plasma reduction task might scatter ions that impact the rounded corners of the hard mask and these scattered ions may undercut the ruthenium layer.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

Figure 2:
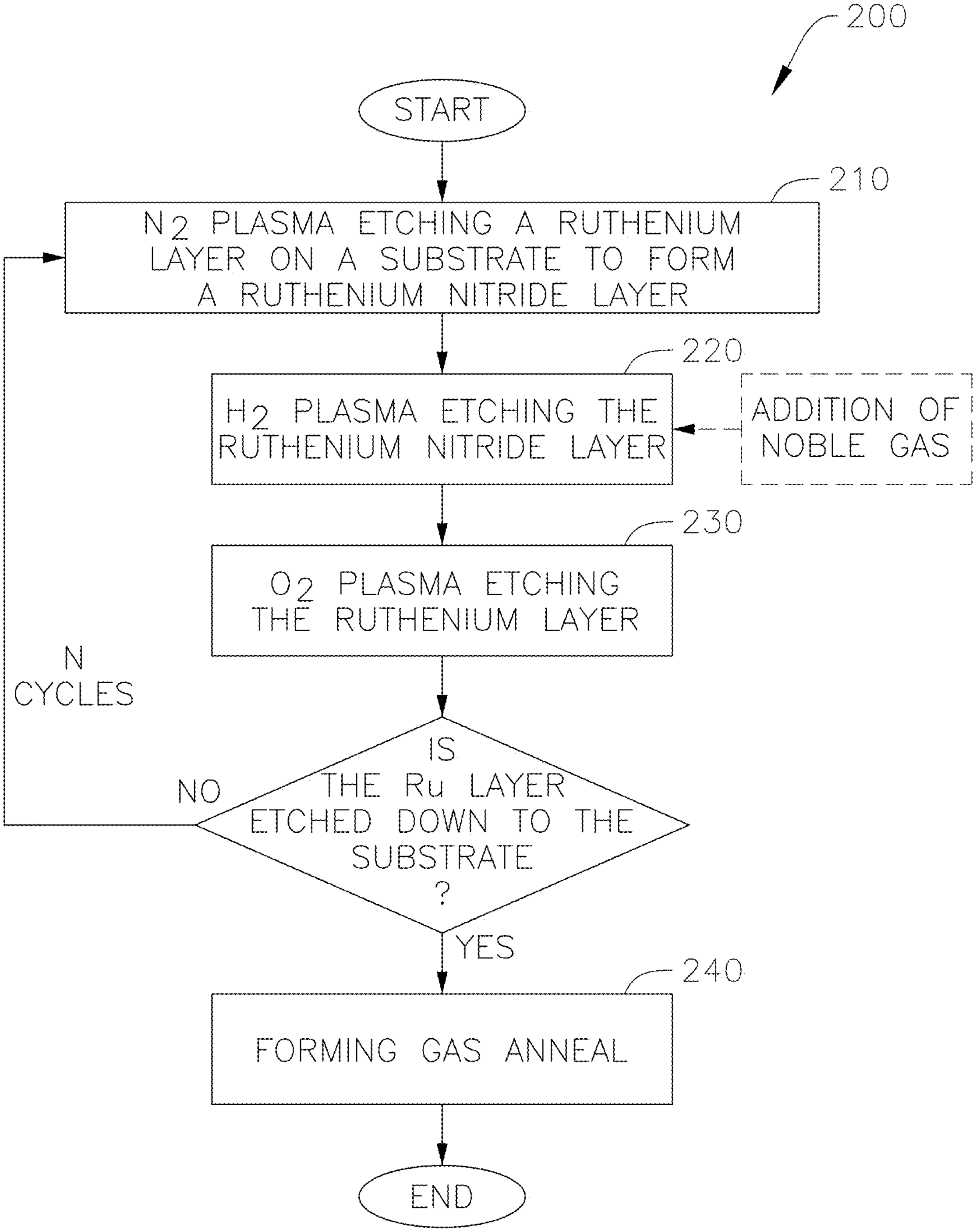
FIG. 2 is a flowchart illustrating tasks of a method of forming ruthenium metal lines in the back-end-of-line (BEOL) of a semiconductor device according to one embodiment of the present disclosure.

FIG. 2 is a flowchart depicting tasks of a method 200 of forming an interconnect in one of the metal layers (e.g., metal layer M1 or metal layer M2) in the back-end-of-line (BEOL) of a semiconductor device 300. FIGS. 3A-3E are cross-sectional views of the semiconductor device 300 during the tasks of the method 200.

Figure 3A:
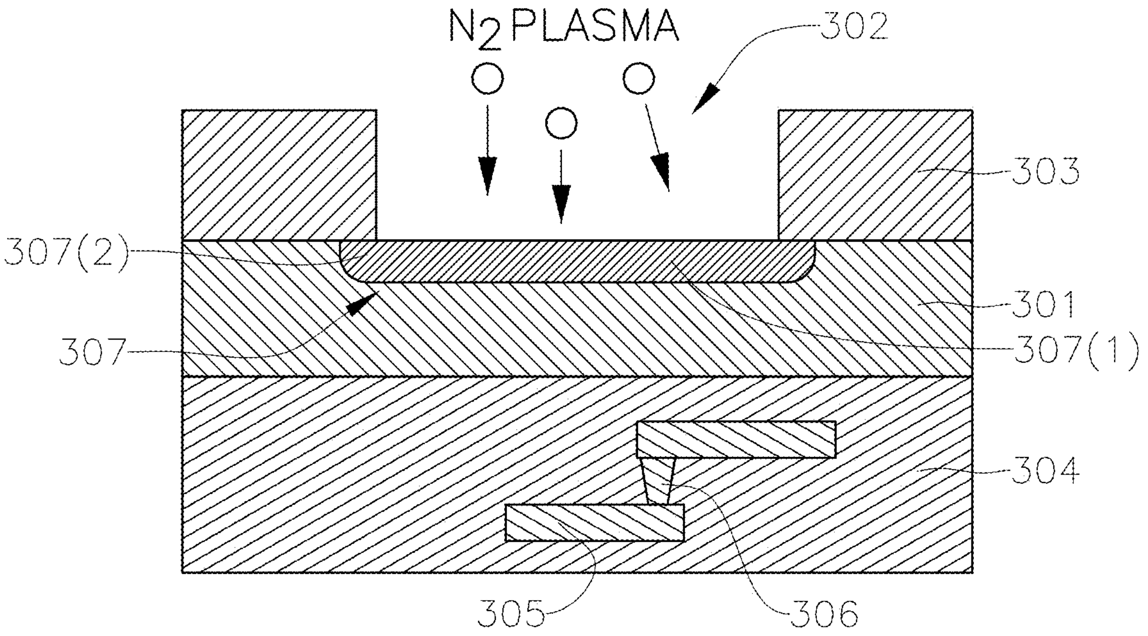
FIGS. 3A-3E are cross-sectional views of the semiconductor device during the tasks of the method of FIG. 2.

As illustrated in FIGS. 2 and 3A, the method 200 includes a task 210 of $N_2$ plasma passivation of a ruthenium (Ru) layer 301 through one or more openings 302 in a patterned hard mask 303 on the ruthenium layer 301. The hard mask 303 may include silicon dioxide ($SiO_2$) or silicon nitride ($SiN_x$). The ruthenium layer 301 is supported on a silicon substrate 304. The silicon substrate 304 includes transistor devices 305 (e.g., NMOS and/or PMOS devices) and vias 306 interconnecting the transistor devices 305. As illustrated in FIG. 2A, during the task 210 of $N_2$ plasma passivation, the N species form a thin ruthenium nitride ($RuN_x$) layer 307 on the exposed upper surface of the ruthenium layer 301. Additionally, in the illustrated embodiment, the thin $RuN_x$ layer 307 extends under a portion of the hard mask 303 (i.e., the thin $RuN_x$ layer 307 formed by the $N_2$ plasma passivation task 210 is wider than the corresponding opening 302 in the hard mask 303 due to the reactivity of the radicals in the $N_2$ gas). Accordingly, the thin $RuN_x$ layer 307 includes a first portion 307(1) that is underneath the opening 302 in the hard mask 303 and a second portion 307(2) that is underneath the hard mask 303.

In one or more embodiments, the task 210 of $N_2$ plasma passivation may be performed with a radio frequency (RF) power in a range from approximately 300 watts (W) to approximately 700 W, a bias in a range from approximately 8 W to approximately 12 W, a pressure in a range from approximately 24 millitorr (mTorr) to approximately 36 mTorr, and for a duration of approximately 24 seconds to approximately 36 seconds. In one embodiment, the task 210 of $N_2$ plasma passivation may be performed with an RF power of approximately 500 W, a bias of approximately 10 W, a pressure of approximately 30 m Torr, and for a duration of approximately 30 seconds.

Figure 3B:
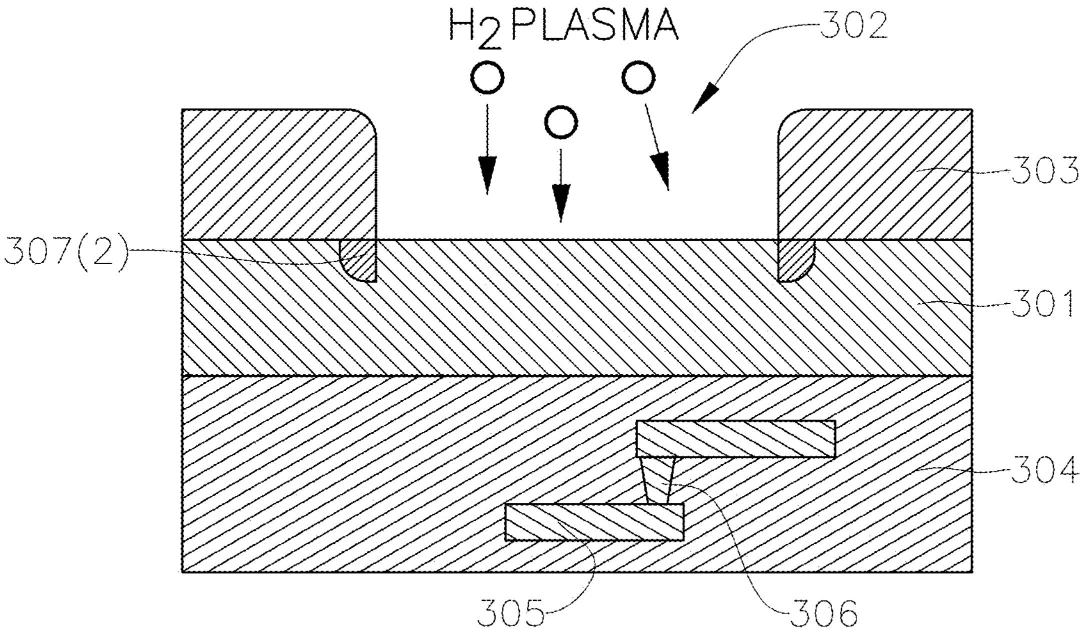

With reference now to FIGS. 2 and 3B, the method 200 also includes a task 220 of $H_2$ plasma reduction. During the task 220 of $H_2$ plasma reduction, the $H_2$ gas removes a portion of the thin $RuN_x$ layer 307, which was formed in task 210 (see FIG. 3A), below the opening 302 in the hard mask 303. The $H_2$ gas may remove the portion of the thin $RuN_x$ layer 307 below the opening 302 in the hard mask 303 by reducing any oxides or nitrides to ruthenium. Additionally, following the task 220 of $H_2$ plasma reduction, the portion of the $RuN_x$ layer 307 underneath the hard mask 303 remains due to the vertical reactivity of the $H_2$ ions. As described in more detail below, the portion of the $RuN_x$ layer 307 that remains underneath the hard mask 303 following task 220 functions as a diffusion barrier during a subsequent task of the method 200. Furthermore, in one or more embodiments, the task 220 of $H_2$ plasma reduction etches a portion of the ruthenium layer 301 below the thin $RuN_x$ layer 307, which may be due to the formation of $RuH_x$.

In one or more embodiments, the $H_2$ plasma reduction task 220 may include a mixture of $H_2$ and a noble gas (e.g., the $H_2$ gas may be mixed with argon (Ar), helium (He), krypton (Kr), neon (Ne), xenon (Xe), and/or radon (Rn)). The addition of a noble gas is configured to shift the electron temperature distribution and thereby reduce the number of $H_2$ ions striking the hard mask 303, which might otherwise cause the sidewall of the hard mask 303 to become rounded (e.g., the addition of the noble gas is configured to minimize or at least reduce the rounding of the upper corners 308 of the hard mask 303 adjacent to the opening 302, which have the highest flux). In this manner, including a noble gas in the $H_2$ plasma reduction task 220 is configured to reduce the rounding of the sidewall of the hard mask 303 compared to an embodiment in which the $H_2$ plasma reduction task 220 is performed with $H_2$ only. As described in more detail below, the rounding of the sidewall of the hard mask 303 might otherwise cause the scattering of ions that may undercut the ruthenium layer 301 during a subsequent task of the method 200. In one or more embodiments, the ratio of $H_2$ and Ar (i.e., $H_2$:Ar) in the task 220 may be in a range from approximately 1:2 to approximately 4:1. For instance, in one or more embodiments, the task 220 of plasma reduction may utilize a $H_2$:Ar 1:2 mixture, a $H_2$:Ar 1:1 mixture, a $H_2$:Ar 2:1 mixture, or a $H_2$:Ar 4:1 mixture.

In one or more embodiments, the task 210 of $H_2$ plasma passivation (utilizing $H_2$ or $H_2$ and a noble gas, such as argon) may be performed with an RF power in a range from approximately 300 W to approximately 700 W, a bias in a range from approximately 12 W to approximately 18 W, a pressure in a range from approximately 40 mTorr to approximately 60 m Torr, and for a duration of approximately 12 seconds to approximately 18 seconds. In one embodiment, the task 220 of $H_2$ plasma reduction (utilizing $H_2$ or $H_2$ and a noble gas, such as argon) may be performed with an RF power of approximately 500 W, a bias of approximately 15 W, a pressure of approximately 50 mTorr, and for a duration of approximately 15 seconds.

Figure 3C:
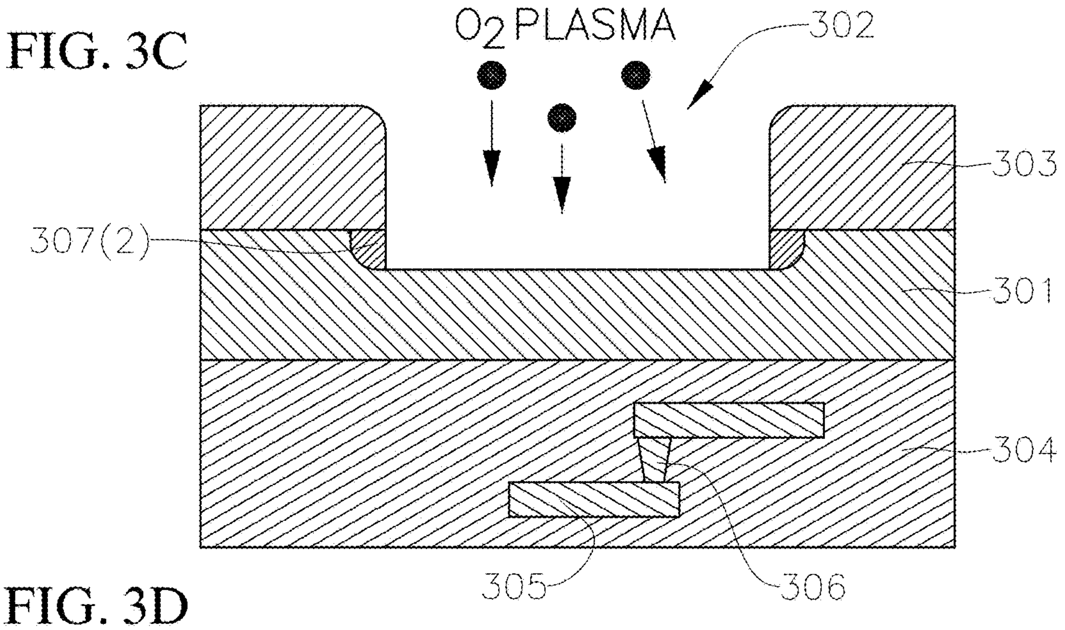

With reference now to FIGS. 2 and 3C, the method 200 also includes a task 230 of $O_2$ plasma etching the ruthenium layer 301 after the task 220 of $H_2$ plasma reduction. During the task 230 of $O_2$ plasma etching, the $O_2$ gas etches the ruthenium layer 301 by forming volatile $RuO_4$, as well as forming $RuO_2$ on the surface of the ruthenium layer 301. In one or more embodiments, the task 230 of $O_2$ plasma etching may be performed with an RF power in a range from approximately 300 W to approximately 700 W, a bias in a range from approximately 0 W to approximately 1 W, a pressure in a range from approximately 24 mTorr to approximately 36 mTorr, and for a duration of approximately 24 seconds to approximately 36 seconds. In one embodiment, the task 230 of $O_2$ plasma etching may be performed with an RF power of approximately 500 W, a bias of approximately 0 W, a pressure of approximately 30 mTorr, and for a duration of approximately 30 seconds.

In one or more embodiments, the task 210 of $N_2$ plasma passivation, the task 220 of $H_2$ (or $H_2$+Ar) plasma reduction, and the task 230 of $O_2$ etching are repeatedly performed. In one or more embodiments, the plasma tasks 210, 220, and 230 may each be repeatedly performed in that order a number of times in a range from 5 to 40. The number of repetitions may depend, for example, on the conditions (e.g., the RF power, the pressure, and the duration) of the plasma tasks 210, 220, 230.

In one or more embodiments, one or more parameters of the $H_2$ plasma reduction task 220 may be selected to minimize or at least reduce the degradation of the hard mask 303 and thereby increase the fidelity and profile control of the method 200. Otherwise, the method 200 may result in undesirable rounding of the sidewall corners 308 of the hard mask 303. In one or more embodiments, the task 220 of $H_2$ plasma reduction (or $H_2$ and a noble gas plasma etching) may be performed for a duration that is approximately half of the duration of the task 210 of the $N_2$ plasma passivation and/or the task 230 of the $O_2$ plasma etching. In one or more embodiments, the task 220 of $H_2$ plasma reduction (or $H_2$ and the noble plasma etching) may be performed at a higher pressure (e.g., an approximately 50% higher pressure or an approximately 60% higher pressure or more) than the task 210 of $N_2$ plasma passivation and/or the task 230 of the $O_2$ plasma etching. Lowering the exposure time and decreasing the electron temperature by reducing the RF power and increasing the pressure of the $H_2$ plasma reduction task 220 is configured to reduce the degradation of the sidewalls of the hard mask 303, and thereby reduce the undercut of the ruthenium layer 201.

In one or more embodiments, the parameters of the $N_2$ plasma passivation task 210, the $H_2$ plasma reduction task 220, and the $O_2$ plasma etching task 230 (e.g., radio frequency power, bias power, pressure, and/or process duration) may vary depending, for example, on the size of the reactor utilized.

Figure 4A:
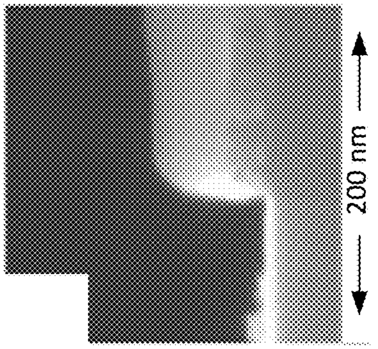
FIGS. 4A-4E are scanning electron microscope (SEM) images depicting a $SiO_2$-patterned ruthenium layer after being exposed to 9 cycles of an $N_2$ plasma passivation task, an $H_2$+Ar reduction task, and an $O_2$ plasma etch task in which the ratio of $H_2$ to Ar is $H_2$:Ar 1:2, $H_2$:Ar 1:1, $H_2$:Ar 1:1, $H_2$:Ar 4:1, and $H_2$ only, respectively.
Figure 4B:
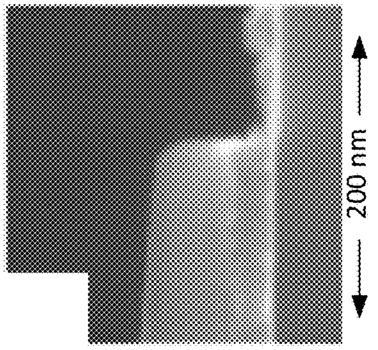
Figure 4C:
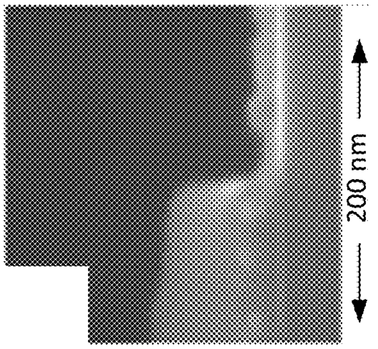
Figure 4D:
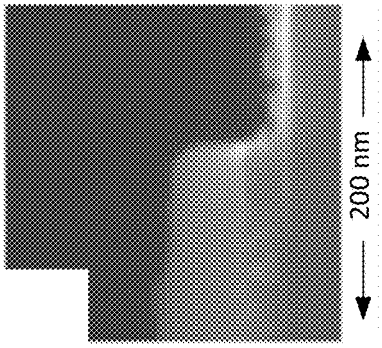
Figure 4E:
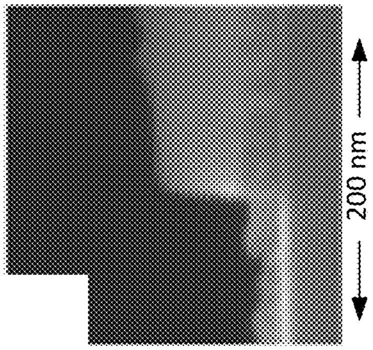

FIGS. 4A-4D are scanning electron microscope (SEM) images depicting the $SiO_2$ hard mask 303 and the ruthenium layer 301 after 9 iterations or cycles of the three plasma tasks 210, 220, and 230 with different $H_2$:Ar ratios. FIG. 4A depicts the $SiO_2$ hard mask 303 and the ruthenium layer 301 after 9 iterations or cycles of the three plasma tasks 210, 220, and 230 with an $H_2$:Ar of approximately 1:2. FIG. 4B depicts the $SiO_2$ hard mask 303 and the ruthenium layer 301 after 9 iterations or cycles of the three plasma tasks 210, 220, and 230 with an $H_2$:Ar of approximately 1:1. FIG. 4C depicts the $SiO_2$ hard mask 303 and the ruthenium layer 301 after 9 iterations or cycles of the three plasma tasks 210, 220, and 230 with an $H_2$:Ar of approximately 2:1. FIG. 4D depicts the $SiO_2$ hard mask 303 and the ruthenium layer 301 after 9 iterations or cycles of the three plasma tasks 210, 220, and 230 with an $H_2$:Ar of approximately 4:1. FIG. 4E depicts the $SiO_2$ hard mask 303 and the ruthenium layer 301 after 9 iterations or cycles of the three plasma tasks 210, 220, and 230 in which the $H_2$ plasma reduction task was performed without Ar (e.g., $H_2$ only). As illustrated in these images, hard mask 303 had slightly less corner rounding and the ruthenium layer 301 had no discernable undercut with decreasing amounts of argon.

Figure 3D:
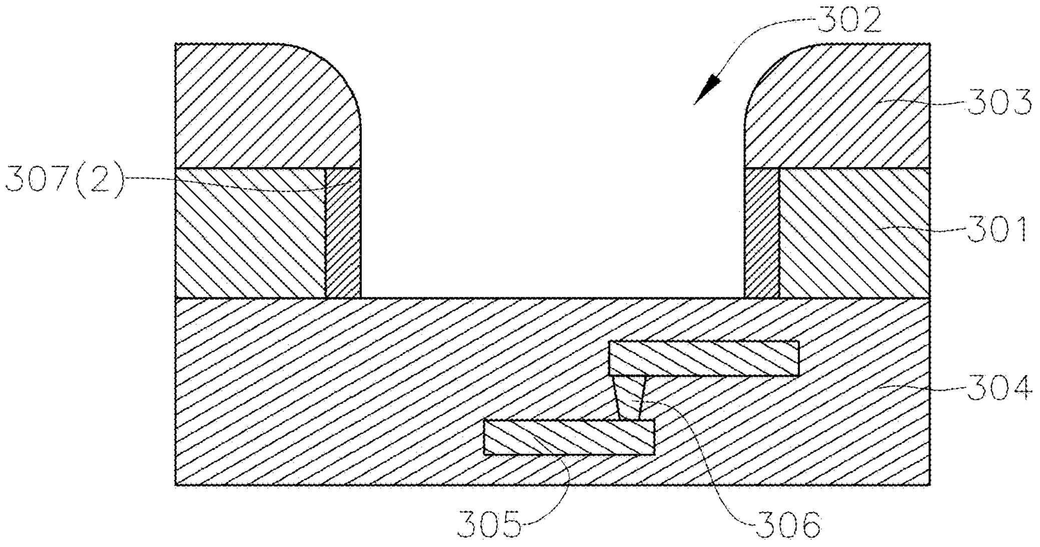

With reference now to FIGS. 2 and 3D, the $N_2$ plasma passivation task 210, the $H_2$ plasma reduction task 220, and the $O_2$ plasma etching task 230 may be repeatedly performed until the ruthenium layer 301 is etched down to the silicon substrate 304. Accordingly, in one or more embodiments, following the $O_2$ plasma etching task 230 of the final cycle, the portion of the ruthenium layer 301 underneath the opening 302 in the hard mask 303 is removed all the way down (or substantially all the way down) to the silicon substrate 304. Accordingly, in one or more embodiments, a portion of an upper surface of the silicon substrate 304 is exposed following the $O_2$ plasma etching task 230 of the final cycle. The number N of iterations or cycles depends on the thickness of the ruthenium layer 301 and the etch rate of each $O_2$ plasma etching task 220. For example, in one or more embodiments in which the ruthenium layer 301 has a thickness in a range from approximately 20 nm to approximately 400 nm and each $O_2$ plasma etching task 220 has an etch rate of approximately 1 nm per cycle, the method 200 may include performing 20 to 400 iterations of each of the $N_2$ plasma etching task 210, the $H_2$ plasma etching task 220, and the $O_2$ plasma etching task 220.

Figure 3E:
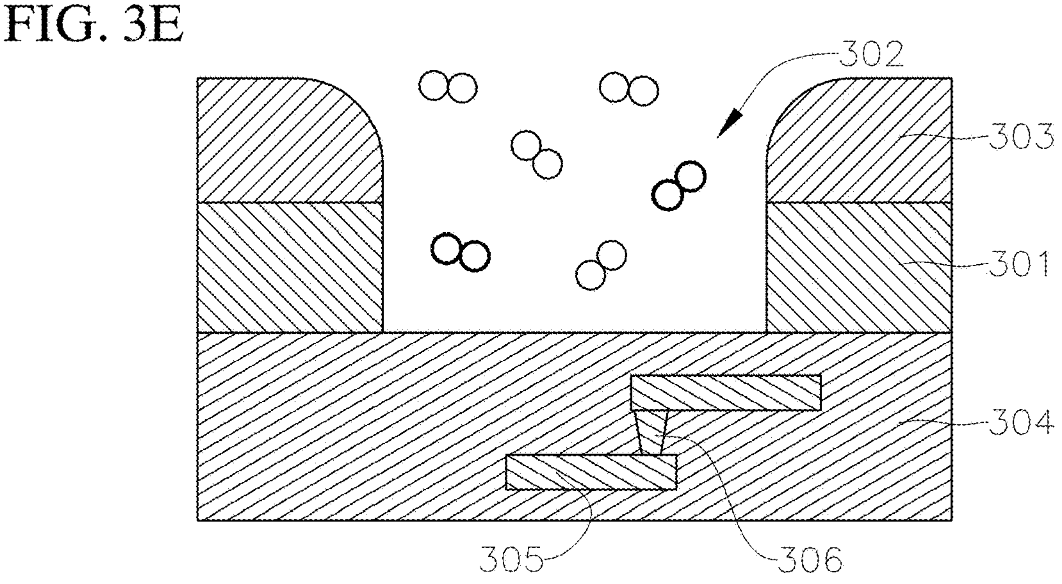

With reference now to FIGS. 2 and 3E, the method 200 also includes a task 240 of performing a forming gas anneal after completing all of the cycles of the $N_2$ plasma passivation task 210, the $H_2$ plasma reduction task 220, and the $O_2$ plasma etching task 230. The task 240 of performing the forming gas anneal is configured to repair the ruthenium layer 301.

Figures 5A, 5B, 5C:
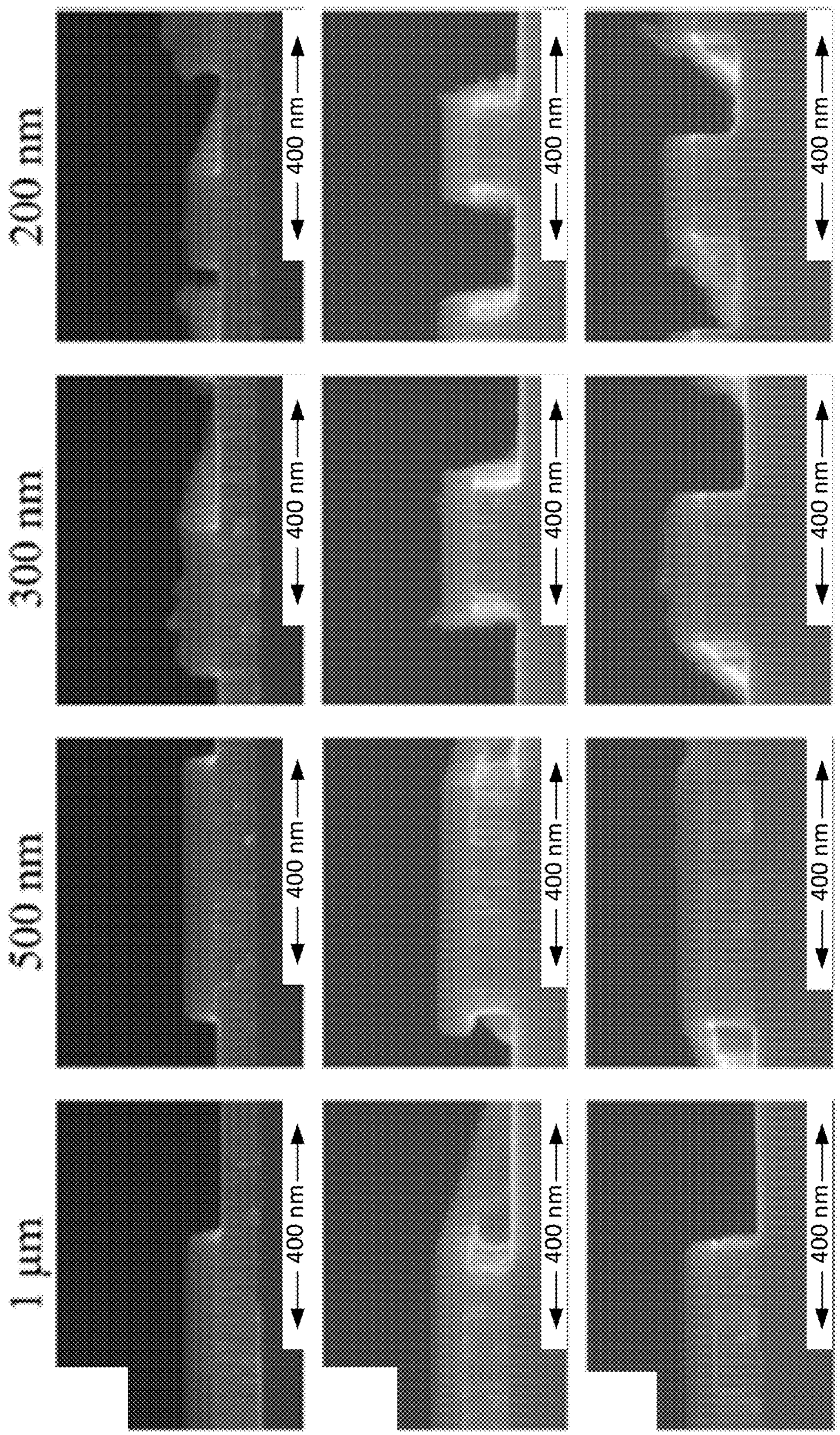
FIGS. 5A-5C are SEM images depicting a $SiN_x$-patterned ruthenium layer having a line width of 1 um, 500 nm, 300 nm, and 200 nm as fabricated, after 9 minutes of $O_2$ exposure, and after 18 cycles of an $N_2$ plasma passivation task, an $H_2$ reduction task, and an $O_2$ plasma etch task, respectively.
Figure 6A:
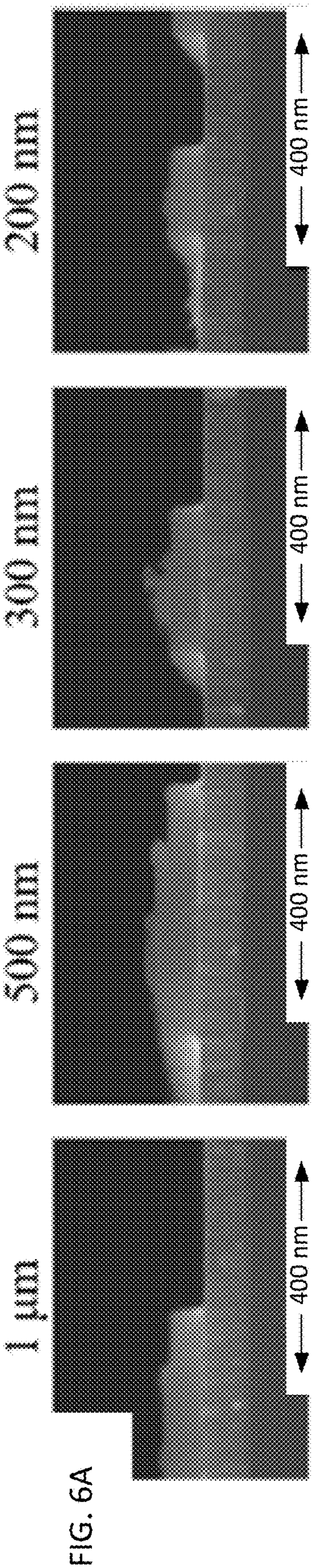
FIGS. 6A-6C are SEM images depicting a $SiO_2$-patterned ruthenium layer having a line width of 1 um, 500 nm, 300 nm, and 200 nm as fabricated, after 9 minutes of $O_2$ exposure, and after 18 cycles of an $N_2$ plasma passivation task, an $H_2$ reduction task, and an $O_2$ plasma etch task, respectively.
Figure 6B:
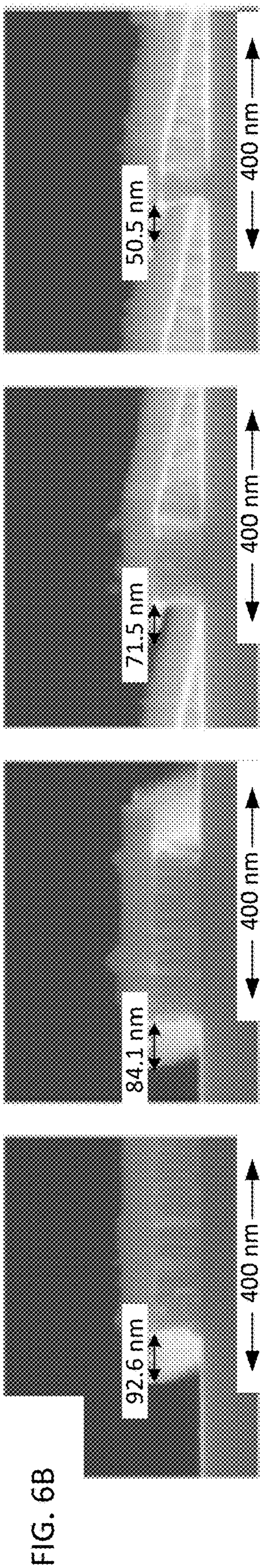
Figure 6C:
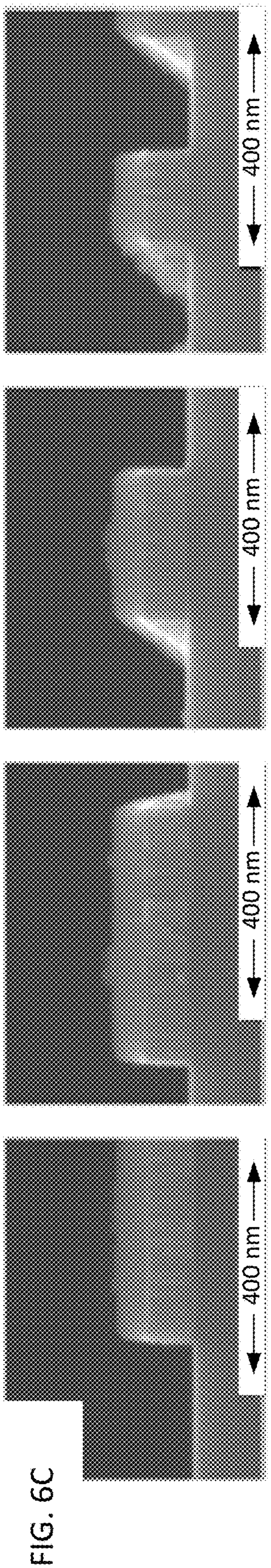

FIGS. 5A-5C are SEM images depicting a $SiN_x$ hard mask 303 on a ruthenium layer 301 having a line width of approximately 1 um (approximately 1,000 nm), approximately 500 nm, approximately 300 nm, and approximately 200 nm (i) as fabricated; (ii) after 9 minutes of $O_2$ exposure; and (iii) after 18 cycles of the $N_2$ plasma passivation task 210, the $H_2$ plasma reduction task 220, and the $O_2$ plasma etch task 230, respectively. FIGS. 6A-6C are SEM images depicting a $SiO_2$ hard mask 303 on a ruthenium layer 301 having a line width of approximately 1 um (approximately 1,000 nm), approximately 500 nm, approximately 300 nm, and approximately 200 nm (i) as fabricated; (ii) after 9 minutes of $O_2$ exposure; and (iii) after 18 cycles of the $N_2$ plasma passivation task 210, the $H_2$ plasma reduction task 220, and the $O_2$ plasma etch task 230, respectively. As illustrated in FIGS. 5A-5C and 6A-6C, the above-described method 200 is suitable for forming the ruthenium interconnects at a variety of different line widths without (or substantially without) any undercut.

The above-described tasks 210, 220, and 230 of etching the ruthenium layer to form a metal interconnect in one of the metal layers (e.g., lines and/or vias in metal layer M1 and/or metal layer M2) during the BEOL process may be repeated to form metal interconnects (lines and/or vias) in other layers of a semiconductor device. Additionally, above-described tasks 210, 220, and 230 of etching the ruthenium layer may be performed to form a ruthenium structure in any other suitable application or device. Furthermore, in one or more embodiments, the above-described tasks 210, 220, and 230 of etching the ruthenium layer are configured to form an opening in the ruthenium layer that has a straight (or substantially straight) sidewall angle (i.e., a non-tapered opening), unlike related art $O_2$ plasma etching methods that form an opening in the ruthenium layer that has a tapered sidewall angle (i.e., an opening that is wider at the top and narrower at the bottom). In one or more embodiments, the above-described tasks 210, 220, and 230 are also configured to etch a ruthenium layer without "loading effects" (or at least mitigating against "loading effects") such that both large and small ruthenium features are etched to the same (or substantially the same) depth, unlike related art $O_2$ plasma etching methods in which larger ruthenium features are etched deeper than smaller ruthenium features.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A method of manufacturing an interconnect in a semiconductor back-end-of-line process, the method comprising:

$N_2$ plasma passivation, through an opening in a hard mask, of a ruthenium layer on a substrate comprising a plurality of transistors, the $N_2$ plasma passivation forming a ruthenium nitride layer on the ruthenium layer, the ruthenium nitride layer comprising a first portion aligned with the opening and a second portion underneath the hard mask;

$H_2$ plasma reduction of the ruthenium nitride layer after the $N_2$ plasma passivation, the $H_2$ plasma reduction removing the first portion of the ruthenium nitride layer; and $O_2$ plasma etching the ruthenium layer after the $H_2$ plasma reduction, repeatedly performing the $N_2$ plasma passivation, the $H_2$ plasma reduction, and the $O_2$ plasma etching for a number of cycles to remove the ruthenium layer down to the substrate.

2. The method of claim 1, further comprising performing a forming gas anneal.

3. The method of claim 1, wherein the $H_2$ plasma reduction comprises a mixture of $H_2$ gas and a noble gas.

4. The method of claim 3, wherein the noble gas is argon (Ar).

5. The method of claim 4, wherein a ratio of $H_2$:Ar is in a range from 1:2 to 4:1.

6. The method of claim 1, wherein the $N_2$ plasma passivation is performed:

with a radio frequency power in a range from approximately 300 W to approximately 700 W, with a bias in a range from approximately 8 W to approximately 12 W, with a pressure in a range from approximately 24 mTorr to approximately 36 mTorr, and for a duration of approximately 24 seconds to approximately 36 seconds.

7. The method of claim 1, wherein the $N_2$ plasma passivation is performed:

with a radio frequency power of approximately 500 W, a bias of approximately 10 W, a pressure of approximately 30 mTorr, and for a duration of approximately 30 seconds.

8. The method of claim 1, wherein the $H_2$ plasma reduction is performed:

with a radio frequency power in a range from approximately 300 W to approximately 700 W, a bias in a range from approximately 12 W to approximately 18 W, a pressure in a range from approximately 40 mTorr to approximately 60 mTorr, and for a duration of approximately 12 seconds to approximately 18 seconds.

9. The method of claim 1, wherein the $H_2$ plasma reduction is performed:

with a radio frequency power of approximately 500 W, a bias of approximately 15 W, a pressure of approximately 50 mTorr, and for a duration of approximately 15 seconds.

10. The method of claim 1, wherein the $H_2$ plasma reduction is performed for a duration that is approximately half of a duration of the $N_2$ plasma passivation and/or the $O_2$ plasma etching.

11. The method of claim 1, wherein the $H_2$ plasma reduction is performed at at least an approximately 50% higher pressure than the $N_2$ plasma passivation and/or the $O_2$ plasma etching.

12. The method of claim 1, wherein the hard mask comprises silicon dioxide ($SiO_2$).

13. The method of claim 1, wherein the hard mask comprises silicon nitride ($SiN_x$).

14. The method of claim 1, wherein a thickness of the ruthenium layer is in a range from approximately 20 nm to approximately 400 nm.

15. The method of claim 14, wherein the number of cycles is in a range from 20 to 400.

16. A method comprising:

$N_2$ plasma passivation, through an opening a hard mask, of a ruthenium layer, the $N_2$ plasma passivation forming a ruthenium nitride layer on the ruthenium layer, the ruthenium nitride layer comprising a first portion aligned with the opening and a second portion underneath the hard mask;

$H_2$ plasma reduction of the ruthenium nitride layer after the $N_2$ plasma passivation, the $H_2$ plasma reduction removing the first portion of the ruthenium nitride layer;

$O_2$ plasma etching the ruthenium layer after the $H_2$ plasma reduction; and repeatedly performing the $N_2$ plasma passivation, the $H_2$ plasma reduction, and the $O_2$ plasma etching.

17. The method of claim 16, wherein the $H_2$ plasma reduction comprises a mixture of $H_2$ gas and a noble gas.

18. The method of claim 16, wherein the $H_2$ plasma reduction is performed for a duration that is approximately half of a duration of the $N_2$ plasma passivation and/or the $O_2$ plasma etching.

19. The method of claim 16, wherein the $H_2$ plasma reduction is performed at at least an approximately 50% higher pressure than the $N_2$ plasma passivation and/or the $O_2$ plasma etching.

20. The method of claim 16, wherein, following the $O_2$ plasma etching, the ruthenium layer has a substantially straight sidewall angle.

* * * * *